United States Patent
Chapski et al.

(10) Patent No.: US 7,804,371 B2
(45) Date of Patent: Sep. 28, 2010

(54) SYSTEMS, MODULES, CHIPS, CIRCUITS AND METHODS WITH DELAY TRIM VALUE UPDATES ON POWER-UP

(75) Inventors: Stan Chapski, Saratoga, CA (US); Darmin Jin, Fremont, CA (US); Brian Cheung, San Bruno, CA (US)

(73) Assignee: SanDisk Corporation, Milpitas, CA (US)

( * ) Notice: Subject to any disclaimer, the term of this patent is extended or adjusted under 35 U.S.C. 154(b) by 27 days.

(21) Appl. No.: 11/967,467

(22) Filed: Dec. 31, 2007

(65) Prior Publication Data

US 2008/0238555 A1    Oct. 2, 2008

Related U.S. Application Data

(60) Provisional application No. 60/934,917, filed on Dec. 31, 2006, provisional application No. 60/934,918, filed on Dec. 31, 2006.

(51) Int. Cl.
*G01R 23/00* (2006.01)
(52) U.S. Cl. .......................................... 331/44; 331/57
(58) Field of Classification Search .................... 331/44, 331/57
See application file for complete search history.

(56) References Cited

U.S. PATENT DOCUMENTS

| | | | |
|---|---|---|---|
| 4,902,986 | A | 2/1990 | Lesmeister |
| 5,878,097 | A | 3/1999 | Hase et al. |
| 6,121,810 | A | 9/2000 | Philpott |
| 7,109,809 | B1 | 9/2006 | Groen et al. |
| 2003/0122630 | A1* | 7/2003 | Fallisgaard et al. ......... 331/158 |
| 2005/0149777 | A1* | 7/2005 | Yuan et al. .................. 714/700 |

OTHER PUBLICATIONS

International Search Report mailed May 14, 2008 for International Application No. PCT/US2007/089196.
Written Opinion of the International Searching Authority mailed on May 14, 2008 for International Application No. PCT/US2007/089196.
International Search Report mailed May 14, 2008 for International Application No. PCT/US2007/089196 (3 pages).
Written Opinion of the International Searching Authority mailed May 14, 2008 for International Application No. PCT/US2007/089196 (7 pages).

* cited by examiner

*Primary Examiner*—Joseph Chang
(74) *Attorney, Agent, or Firm*—Brinks Hofer Gilson & Lione

(57) ABSTRACT

Timing measurement is performed by a digital oscillator, using a calibration value which is calculated after chip fabrication is completed, and automatically loaded into selection logic at powerup.

48 Claims, 10 Drawing Sheets

Block diagram of delay cell with calibration clock divider

Block diagram of delay cell with calibration clock divider

| Signal | Width | Direction | Comment |
|---|---|---|---|
| data | 1 | Input | Signal input |
| dataOut | 1 | Output | Signal output. Delayed version of data |
| S[3:0] | 4 | Input | Select the delay amount. The delay select value is determined by the application. In test mode, selects a different number of delay stages for the internal ring oscillator. Setting value 4'b0000 inhibits a clock output on the Counter output. |
| Test | 1 | Input | Assert test mode. Active high. |
| Counter | 1 | Output | Test mode clock. |
| dis | 1 | Input | Disable glitching When asserted high prevents any switching activity, such as glitching, on dataOut when changing S and data is not switching. It routes the input through a glitch free multiplexer.

When asserted high, prevents the clock on the dataOut output regardless of the value of the Test input level. |

Delay cell module interface

FIG. 2

| Signal | Width | Direction | Comment |
|---|---|---|---|
| data_in | 1 | Input | Clock input |
| data_out | 1 | Output | Divided clock input |
| sel_in | 5 | Input | Select the divider value. The divide ratio is 2 (sel_+1). For example, sel_in of 0 results in a divide by 2 and sel_in of 16 results in a divide by 217. Any value over 16 results in a divide by $2^{17}$. |
| rst_n | 1 | Input | 0: hold the counter inactive and data_out = 0.<br>1: the counter is active and data_out is toggling at a frequency determined by the sel_in value. |

Delay cell test mode clock divider module interface
*FIG. 3*

Delay cell timing diagram

| Select Line | VCC=1.32V Temp=-40C FNFP | | VCC=1.20V Temp=25C TNTP | | VCC=1.08V Temp=125C SNSP | |
|---|---|---|---|---|---|---|
| | tplh (ns) | tphl (ns) | tplh (ns) | tphl (ns) | tplh (ns) | tphl (ns) |
| 0 | 0.1381 | 0.1951 | 0.2106 | 0.2800 | 0.3670 | 0.3994 |
| 1 | 0.5850 | 0.6893 | 0.8711 | 1.0060 | 1.4150 | 1.5480 |
| 2 | 0.0837 | 0.9719 | 1.3100 | 1.4330 | 2.1260 | 2.2430 |
| 3 | 1.2330 | 1.3670 | 1.8470 | 2.0290 | 2.9800 | 3.2000 |
| 4 | 1.5600 | 1.7530 | 2.3350 | 2.6500 | 3.7500 | 4.3030 |
| 5 | 1.8330 | 2.0170 | 2.7470 | 3.0490 | 4.4170 | 4.9510 |
| 6 | 2.1190 | 2.2910 | 3.1810 | 3.4650 | 5.1190 | 5.6230 |
| 7 | 2.4210 | 2.5750 | 3.6430 | 3.8910 | 5.8670 | 6.3070 |
| 8 | 2.8970 | 3.0600 | 4.3460 | 4.6350 | 6.9160 | 7.5760 |
| 9 | 3.3530 | 3.5100 | 5.0300 | 5.3190 | 7.9660 | 8.7280 |
| 10 | 3.8090 | 3.9580 | 5.7160 | 6.0000 | 9.0210 | 9.8750 |
| 11 | 4.2660 | 4.4010 | 6.4030 | 6.6700 | 10.0800 | 11.0000 |
| 12 | 4.7350 | 4.8680 | 7.0990 | 7.3900 | 11.1300 | 12.2300 |
| 13 | 5.1910 | 5.3170 | 7.7830 | 8.0170 | 12.1800 | 13.3800 |
| 14 | 5.6410 | 5.7590 | 8.4570 | 8.7410 | 13.2200 | 14.5100 |
| 15 | 6.0950 | 6.2000 | 9.1430 | 9.4100 | 14.2800 | 15.6300 |

Propagation delay for one standard load
*FIG. 5*

| Select Line | VCC=1.32V Temp=-40C FNFP | | VCC=1.20V Temp=25C TNTP | | VCC=1.08V Temp=125C SNSP | |
|---|---|---|---|---|---|---|
| | tplh (ns) | tphl (ns) | tplh (ns) | tphl (ns) | tplh (ns) | tphl (ns) |
| 0 | 0.1462 | 0.2027 | 0.2217 | 0.2902 | 0.3830 | 0.4137 |
| 1 | 0.5919 | 0.6962 | 0.8802 | 1.0150 | 1.4270 | 1.5610 |
| 2 | 0.8807 | 0.9788 | 1.3190 | 1.4430 | 2.1390 | 2.2550 |
| 3 | 1.2400 | 1.3740 | 1.8560 | 2.0380 | 2.9920 | 3.2130 |
| 4 | 1.5670 | 1.7600 | 2.3440 | 2.6590 | 3.7630 | 4.3160 |
| 5 | 1.8390 | 2.0240 | 2.7570 | 3.0580 | 4.4300 | 4.9650 |
| 6 | 2.1260 | 2.2980 | 3.1910 | 3.4740 | 5.1310 | 5.6360 |
| 7 | 2.4280 | 2.5820 | 3.6520 | 3.9000 | 5.8790 | 6.3190 |
| 8 | 2.9040 | 3.0670 | 4.3560 | 4.6450 | 6.9300 | 7.5880 |
| 9 | 3.3600 | 3.5160 | 5.0400 | 5.3280 | 7.9790 | 8.7410 |
| 10 | 3.8160 | 3.9650 | 5.7260 | 6.0090 | 9.0340 | 9.8870 |
| 11 | 4.2730 | 4.4080 | 6.4120 | 6.6790 | 10.0900 | 11.0100 |
| 12 | 4.7420 | 4.8760 | 7.1080 | 7.3990 | 11.1400 | 12.2400 |
| 13 | 5.1980 | 5.3240 | 7.7930 | 8.0810 | 12.2000 | 13.4000 |
| 14 | 5.6470 | 5.7650 | 8.4670 | 8.7510 | 13.2300 | 14.5300 |
| 15 | 6.1020 | 6.2070 | 9.1510 | 9.4190 | 14.2900 | 15.6500 |

Propagation delay with 5 standard loads
*FIG. 6*

| Select Line | VCC=1.32V Temp=-40C FNFP | | VCC=1.20V Temp=25C TNTP | | VCC=1.08V Temp=125C SNSP | |
|---|---|---|---|---|---|---|
| | trise (ns) | tfall (ns) | trise (ns) | tfall (ns) | trise (ns) | tfall (ns) |
| 0 | 0.0230 | 0.0261 | 0.0328 | 0.0366 | 0.0526 | 0.0534 |
| 1 | 0.0200 | 0.0224 | 0.0265 | 0.0312 | 0.0380 | 0.0462 |
| 2 | 0.0195 | 0.0225 | 0.0265 | 0.0315 | 0.0365 | 0.0457 |
| 3 | 0.0200 | 0.0224 | 0.0275 | 0.0311 | 0.0379 | 0.0459 |
| 4 | 0.0201 | 0.0224 | 0.0276 | 0.0314 | 0.0371 | 0.0470 |
| 5 | 0.0195 | 0.0224 | 0.0267 | 0.0316 | 0.0363 | 0.0468 |
| 6 | 0.0199 | 0.0225 | 0.0270 | 0.0313 | 0.0370 | 0.0463 |
| 7 | 0.0202 | 0.0225 | 0.0268 | 0.0318 | 0.0379 | 0.0472 |
| 8 | 0.0202 | 0.0225 | 0.0277 | 0.0315 | 0.0372 | 0.0465 |
| 9 | 0.0202 | 0.0225 | 0.0277 | 0.0316 | 0.0372 | 0.0471 |
| 10 | 0.0202 | 0.0225 | 0.0277 | 0.0317 | 0.0373 | 0.0469 |
| 11 | 0.0202 | 0.0225 | 0.0277 | 0.0316 | 0.0371 | 0.0470 |
| 12 | 0.0203 | 0.0227 | 0.0281 | 0.0315 | 0.0380 | 0.0463 |
| 13 | 0.0203 | 0.0227 | 0.0277 | 0.0316 | 0.0380 | 0.0465 |
| 14 | 0.0203 | 0.0227 | 0.0277 | 0.0315 | 0.0381 | 0.0461 |
| 15 | 0.0203 | 0.0227 | 0.0277 | 0.0316 | 0.0384 | 0.0469 |

Output rise and fall time with one standard load
*FIG. 7*

| Select Line | VCC=1.32V Temp=-40C FNFP | | VCC=1.20V Temp=25C TNTP | | VCC=1.08V Temp=125C SNSP | |
|---|---|---|---|---|---|---|
| | trise (ns) | tfall (ns) | trise (ns) | tfall (ns) | trise (ns) | tfall (ns)l |
| 0 | 0.0274 | 0.0312 | 0.0380 | 0.0429 | 0.0596 | 0.0618 |
| 1 | 0.0232 | 0.0271 | 0.0300 | 0.0370 | 0.0424 | 0.0536 |
| 2 | 0.0228 | 0.0271 | 0.0303 | 0.0370 | 0.0408 | 0.0537 |
| 3 | 0.0232 | 0.0271 | 0.0301 | 0.0369 | 0.0431 | 0.0536 |
| 4 | 0.0229 | 0.0270 | 0.0301 | 0.0368 | 0.0413 | 0.0537 |
| 5 | 0.0231 | 0.0270 | 0.0302 | 0.0368 | 0.0412 | 0.0535 |
| 6 | 0.0228 | 0.0272 | 0.0310 | 0.0370 | 0.0426 | 0.0544 |
| 7 | 0.0235 | 0.0271 | 0.0303 | 0.0371 | 0.0420 | 0.0542 |
| 8 | 0.0233 | 0.0272 | 0.0303 | 0.0374 | 0.0436 | 0.0541 |
| 9 | 0.0233 | 0.0271 | 0.0310 | 0.0374 | 0.0421 | 0.0542 |
| 10 | 0.0235 | 0.0272 | 0.0303 | 0.0374 | 0.0437 | 0.0541 |
| 11 | 0.0235 | 0.0273 | 0.0304 | 0.0372 | 0.0420 | 0.0547 |
| 12 | 0.0236 | 0.0273 | 0.0312 | 0.0375 | 0.0421 | 0.0538 |
| 13 | 0.0236 | 0.0271 | 0.0303 | 0.0370 | 0.0422 | 0.0552 |
| 14 | 0.0235 | 0.0273 | 0.0303 | 0.0370 | 0.0419 | 0.0546 |
| 15 | 0.0236 | 0.0271 | 0.0311 | 0.0373 | 0.0437 | 0.0541 |

Output rise and fall time with five standard loads
*FIG. 8*

Schematic

Schematic

SYSTEMS, MODULES, CHIPS, CIRCUITS AND METHODS WITH DELAY TRIM VALUE UPDATES ON POWER-UP

CROSS-REFERENCE TO RELATED APPLICATIONS

Priority is claimed from U.S. application 60/934,917 (formerly numbered as Ser. No. 11/618,897) and 60/934,918 (formerly numbered as Ser. No. 11/618,898), both filed Dec. 31, 2006, and each hereby incorporated by reference in its entirety.

BACKGROUND

The present application relates to integrated circuits, and particularly to data modules and their controllers which are capable of handling multiple interface standards.

One of the basic requirements of many portable electronics applications is some sort of way to measure time delays. In some applications timestamps are available from a system interface or external data stream, but in many other applications this is not possible. Fixed systems can obtain timing information from a powerline grid, but this too is impossible for some portable systems.

An odd number of inverters connected in a ring will oscillate, and digital inverters which have more complex topologies are also sometimes referred to as ring oscillators (or, more precisely, as free-running oscillators). Many designs have used a so-called ring oscillator as a crude timing reference. However, a problem with ring oscillators is that their speed is affected by a variety of device parameters, including e.g. threshold voltage, gain, saturated current density, and variations in the relative strength of N-channel and P-channel devices. Thus unavoidable variations in process parameters can result in significant variations in the speed of a ring oscillator.

The uncertainty due to process variation does not stand alone. Temperature and supply voltage variation also can have a great effect on the oscillator frequency. Since these variations too are unpredictable, the total variation across the relevant set of parameters can be large, e.g. 3:1 or more.

Thus ring oscillators are helpful for a minimal reference, but do not offer enough accuracy for many applications.

One area where all these problems converge is in portable memory modules. As discussed below, the control logic in a portable module must be able to measure some timing windows to judge whether a host interface is operational. In a multicompatible module, the problem can be even worse.

One of the conventional ways to get timing information is with a crystal-controlled oscillator. However, crystal oscillators have some significant disadvantages over digital oscillators. Crystal oscillators require use of a discrete component which, although inexpensive, complicates system integration. Ring oscillators can be dropped into a digital design anywhere, without requiring an analog process. Ring oscillators can easily be started, stepped, or stopped, unlike crystal oscillators.

SUMMARY

The present application discloses new approaches to getting timing measurements from a digital oscillator. Since the timing error due to process variation does not change after processing has been completed, that component can be measured in the packaged product. The testing cycle thus measures the error in ring-clocked time measurement, and saves a calibration value into nonvolatile memory. Thereafter, when the module is powered up, it loads the calibration value as part of its power-up routine.

This does not control variation due to temperature and supply voltage, but reduces the total parameter space over which error occurs. Thus the net error of the internal timing measurement can be reduced enough to provide adequate accuracy for some window measurements, as discussed below.

The disclosed innovations, in various embodiments, provide one or more of at least the following advantages:
 No need for external components
 Adequate interface accuracy
 Power efficiency and other advantages of digital oscillator.

BRIEF DESCRIPTION OF THE DRAWINGS

The disclosed inventions will be described with reference to the accompanying drawings, which show important sample embodiments of the invention and which are incorporated in the specification hereof by reference, wherein:

FIG. 2 shows a delay cell module interface data.

FIG. 3 shows a delay cell test mode clock driver module interface data.

FIG. 5 shows a propagation delay for one standard load.

FIG. 6 shows a propagation delay with five standard loads.

FIG. 7 shows output rise and fall time with one standard load.

FIG. 8 shows output rise and fall time with five standard loads.

DETAILED DESCRIPTION

Figure 1:
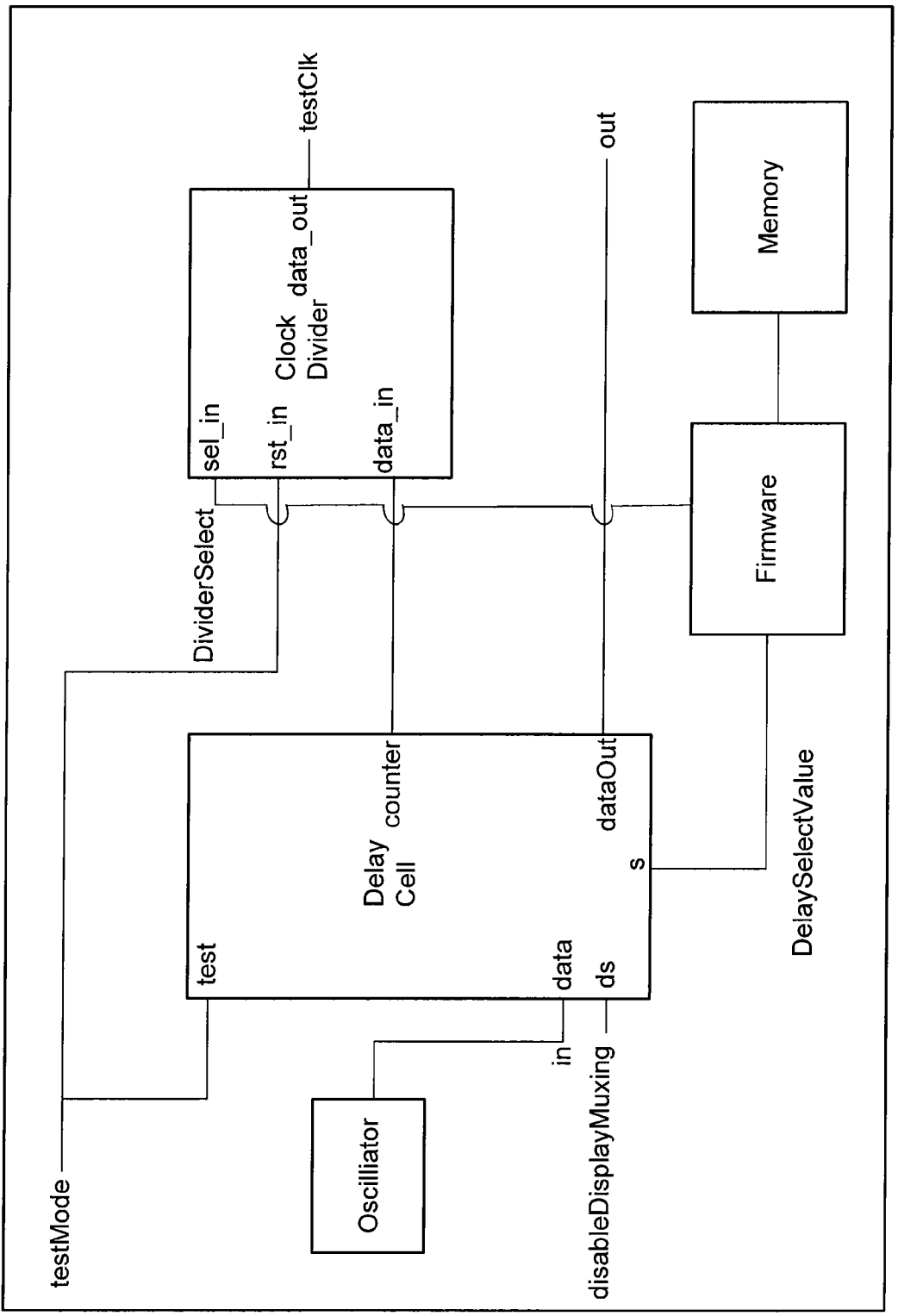
FIG. 1 shows a block diagram of delay cell with calibration clock driver.

The numerous innovative teachings of the present application will be described with particular reference to presently preferred embodiments (by way of example, and not of limitation).

The normal ASIC cell delays can vary in timing over voltage, temperature, and process by as much as 1:3.5 ratio of minimum to maximum timing. This is too much variation for some timing specifications such as those required (by SD or MMC specifications) for the hold time from clock-in to data-out. The present application describes an improved implementation for programmable delays (especially interface timing windows), and a calibration method to determine what those delays should be to compensate for process variation.

The following description shows a sample implementation of a programmable delay cell, application of the cell to resolve timing variance, and a method to determine the delay selection. The purpose of this cell is to solve a problem of too much variance of standard cells from minimum to maximum timing that will cause an implementation to violate a timing specification such as a hold time.

The present application teaches methods in which the process and voltage operating point of the host ASIC is used as a stored calibration input, and retrieved at startup for dynamic adjustment of delay, thus "tuning out" the process dependent timing variation. Temperature variation is expected to be within 10% of nominal.

The delay model defines a behavior of a time delay of a change on an output caused by a change on an input. In response to a change of signal state on an input, the output may change after the propagation delay of the input-output path. For the inertial delay model, the output does not transition if the input returns to the initial value—a pulse—in a time less than the propagation delay of the input-output path.

The standard load is the input of a 2-input NAND gate.

The output port of the delay cell is a delayed in time replica of the input port. The delay cell, in this embodiment, has an input port used to select one of 16 delay values. The select port is a four-bit port (mapped as an address) which selects a delay in the range from minimum to maximum delay (monotonically increasing from the minimum to the maximum value). The minimum value should be zero.

When the test mode is asserted, the delay cell shall produce a clock signal on a test mode clock output port with a period proportional to the maximum delay of the delay cell. The test clock signal will also be produced on the output port of the delay cell. There is a disable input pin (signal dis) that can be asserted to prevent the clock signal from reaching the output port.

The SD/MMC host interface requires a minimum hold time of data referenced to the input clock and a maximum time until the next data is valid. Because of process, voltage, and temperature (PVT) variation, the gate delays meeting minimum timing may exceed maximum timing. Each data path may have different clock to data out values.

Calibrating the Process Delay

The minimum to maximum timing variation can be reduced by using a programmable delay to compensate for process variation of the individual ASIC die. The amount of the compensation delay is derived from a measurement that is proportional to the process delay. The measurement is obtained by a tester that can measure the period of the derived clock of a free-running oscillator with speed of operation proportional to the process variation.

Each data path can have a different clock to output delay. This difference can be minimized by using a delay selector value for each data path. The delay value can be derived from the calibration process described above requiring each path to be calibrated. The selected delay for each data path can also be derived by using one calibrated path value and adjusting the individual delay value based on a characterized measurement. Each path delay can be characterized using a baseline delay value for all paths. The characterized measurement is used to determine an offset to be applied to the calibrated reference. The characterized approach saves tester time and divider/counter logic.

The calibration is done with the card product. The delay values must be stored in persistent memory and loaded by firmware into each delay cell on power up. The ASIC must have a test mode that produces the calibration clock from the delay cell on a pin—such a data pin—available on all product packages. In a contemplated embodiment, the protocol is described below. The test is done on a Tanisys tester requiring that the card can generate/respond to commands to assert or de-assert calibration test mode. The tester measures the period and send it to the card. The card shall store it in a location to be used by firmware to program each delay cell.

A block diagram for a sample embodiment for calibration is shown in FIG. 1, where a clock divider reduces the frequency of the free-running oscillator to a value that can easily be measured by the tester. This divider is required only for the paths being calibrated. In and out are the normal mission mode signals. Testmode places the circuit in test mode for calibration. The DelaySelectValue is chosen to select the desired delay. DividerSelect is chosen to produce a frequency suitable for tester measurement accuracy. DisableDelayMuxing prevents delay cell elements from glitching the dataOut when the DelaySelect Value is being changed.

FIGS. 2 and 3 summarize the interface used, in this sample embodiment, for the delay cell module interface, and for the delay cell test mode clock driver module interface.

Delay Cell Timing

Figure 4:
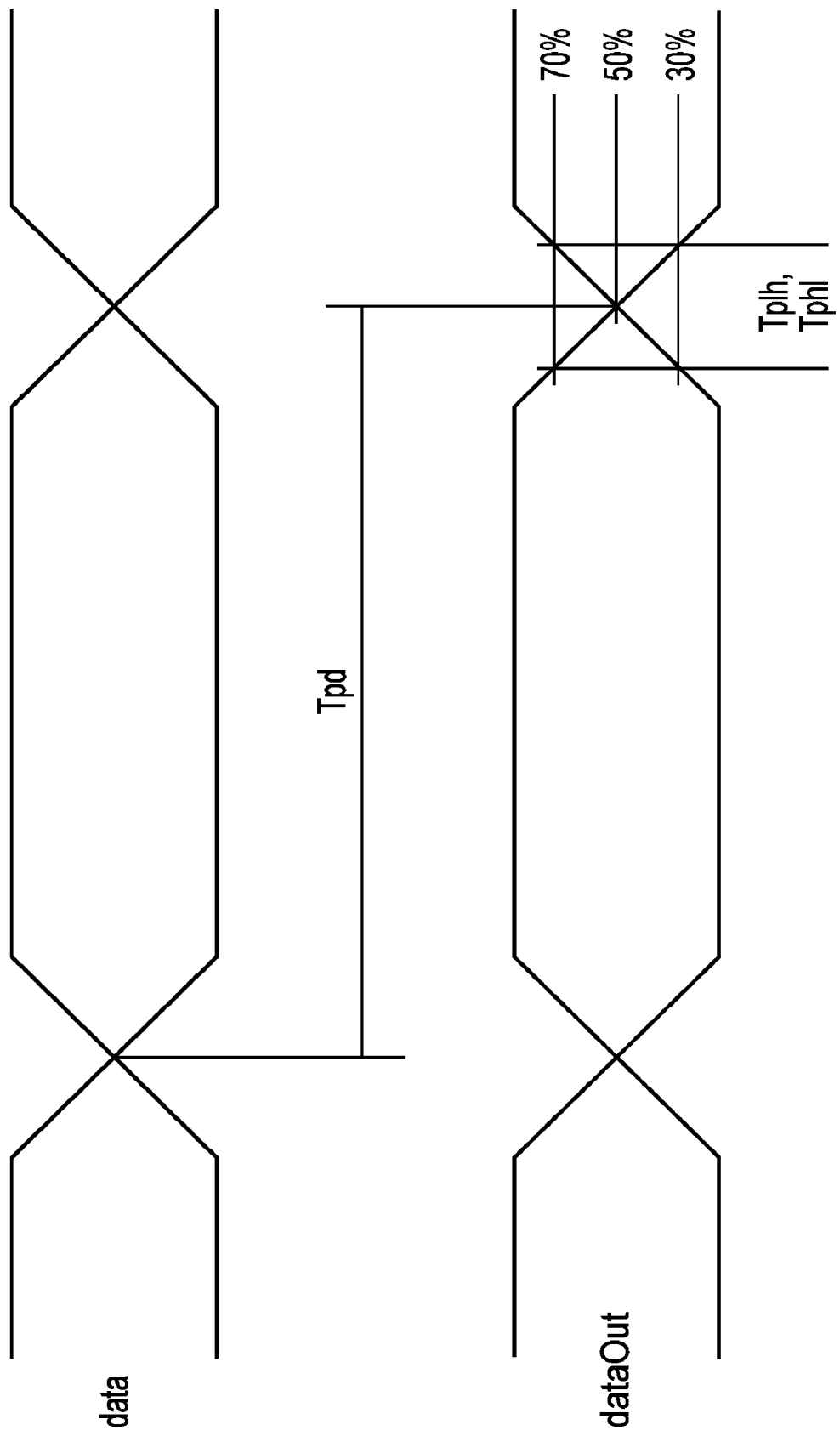
FIG. 4 shows a delay cell timing diagram.
Figure 9A:
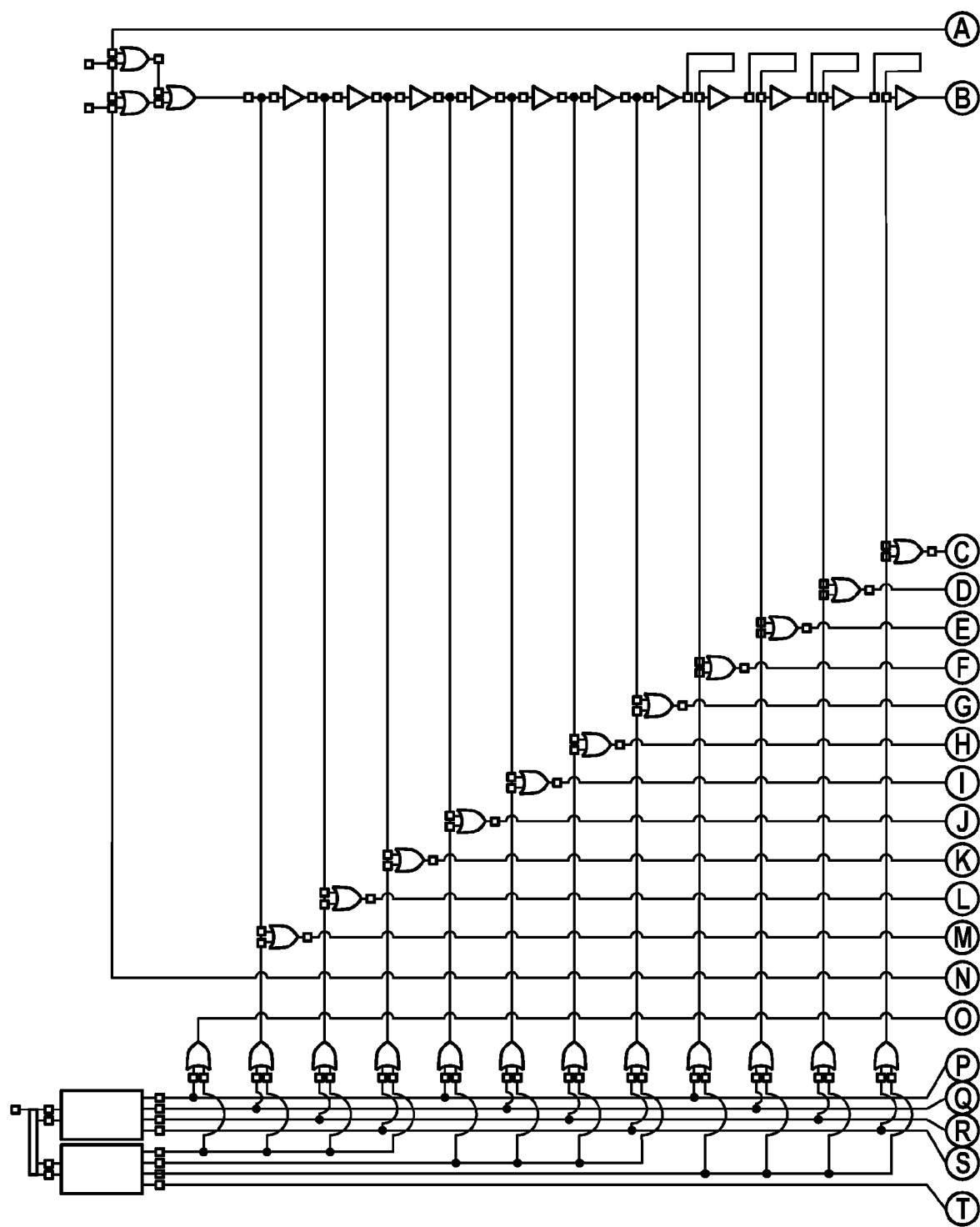
FIG. 9 shows a schematic consistent with an embodiment of the present innovations.
Figure 9B:
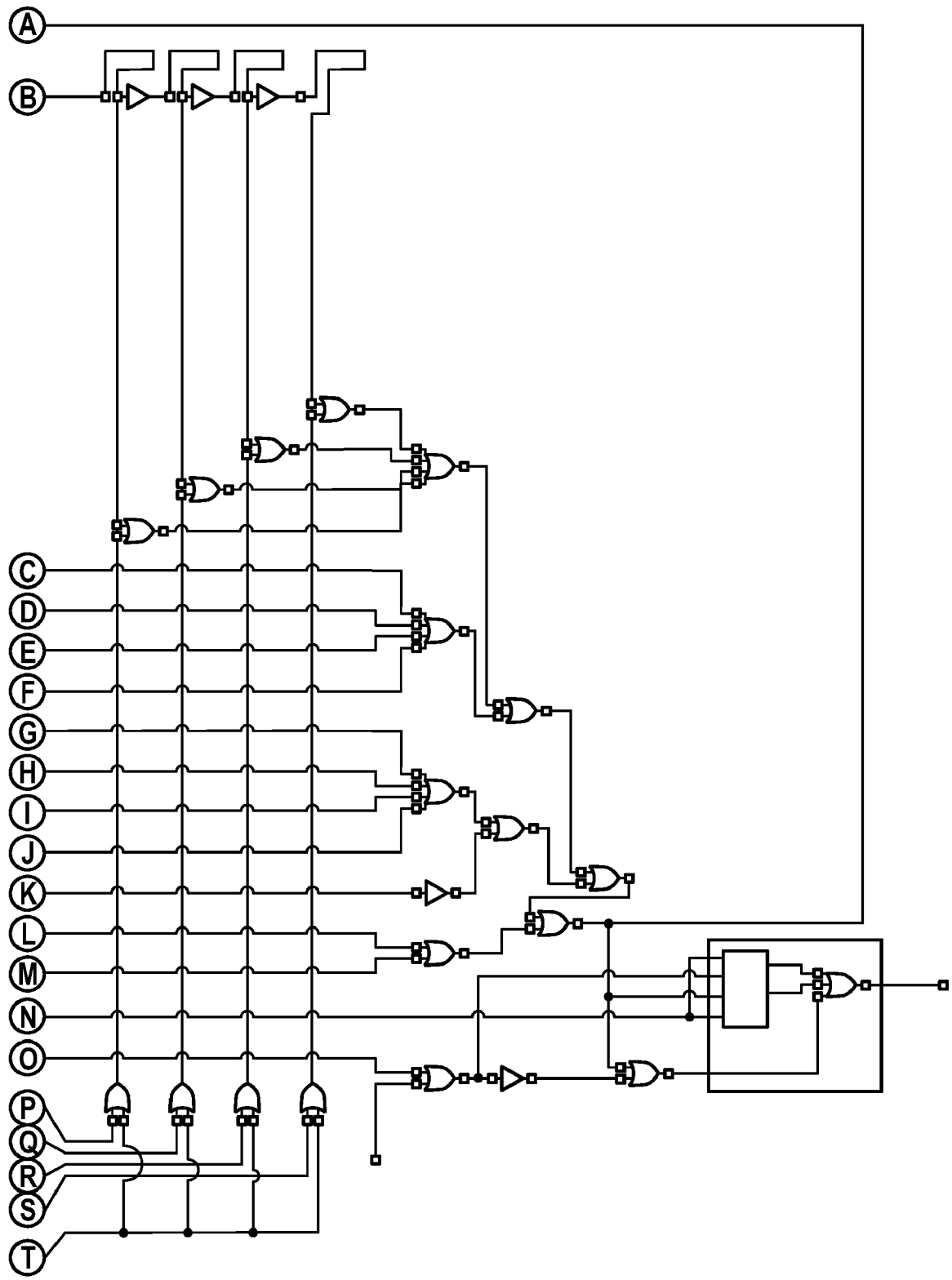

The tables of FIGS. 5 and 6 show expected input to output delay for each select value and for Best, Typical, and Worst case operating conditions. Propagation delay (Tpd) is measured from the 50% point of the input to 50% point of the output. The rise (Tplh) and fall (Tphl) are measured from 30% to 70% and 70% to 30% respectively as shown in the timing diagram of FIG. 4.

The tables of FIGS. 7 and 8 similarly show output rise and fall time for each select value and for Best, Typical, and Worst case operating conditions, under two different load conditions.

According to various disclosed embodiments (but not necessarily all embodiments), there is provided: A method for time measurement within an integrated circuit, comprising the actions of: (a) after fabrication of the integrated circuit is complete, measuring the speed of a free-running oscillator; (b) based on said action (a), storing a calibration value in nonvolatile memory; and thereafter (c) when said oscillator is powered up, retrieving said calibration value and accordingly changing the number of cycles of said oscillator per interval measured.

According to various disclosed embodiments (but not necessarily all embodiments), there is provided: A method for providing a time measurement within an integrated circuit, comprising the actions of: powering up a free-running oscillator for at least some measurements; retrieving a calibration value from nonvolatile memory, and accordingly switching gates to change a timing output which is based on said oscillator.

According to various disclosed embodiments (but not necessarily all embodiments), there is provided: A method for operating a portable memory module, comprising the actions of: when interface timing measurement is required, powering up a free-running digital oscillator; retrieving a calibration value from nonvolatile memory which is integrated with said oscillator, and accordingly switching gates to change the output timing of said oscillator; and then measuring an interface timing relationship using the output timing of said oscillator.

According to various disclosed embodiments (but not necessarily all embodiments), there is provided: An integrated circuit, comprising: a digital oscillator; a nonvolatile memory which holds a calibration value indicative of the process variation component of the speed of said oscillator; and selection logic which selects the number of cycles of said oscillator per interval measured, in dependence on said stored calibration value.

According to various disclosed embodiments (but not necessarily all embodiments), there is provided: An integrated circuit, comprising: a free-running digital oscillator; a nonvolatile memory which holds a calibration value indicative of the process variation component of the speed of said oscillator; selection logic which selects the number of cycles of said oscillator per interval measured, in dependence on said stored calibration value; and a timing measurement stage, which outputs indications of interface timing windows in accordance with an output of said oscillator as modified by said selection logic.

According to various disclosed embodiments (but not necessarily all embodiments), there is provided: An integrated circuit, comprising: a free-running digital oscillator; a nonvolatile memory which holds a calibration value indicative of the process variation component of the speed of said oscillator; selection logic, integrated with said oscillator, which selects the number of cycles of said oscillator per interval measured, in dependence on said stored calibration value as loaded at power-up; and a timing measurement stage, which outputs indications of interface timing windows in accordance with an output of said oscillator as modified by said selection logic.

According to various disclosed embodiments (but not necessarily all embodiments), there is provided: A circuit comprising: means for, at startup, loading a calibration value, obtained at least partly from nonvolatile memory, into a divider circuit; and means for dividing down the output of a digital oscillator by said calibration value, to thereby produce a partially calibrated resultant timing signal.

According to various disclosed embodiments (but not necessarily all embodiments), there is provided a configuration wherein: Timing measurement is performed by a digital oscillator, using a calibration value which is calculated after chip fabrication is completed, and automatically loaded into selection logic at powerup.

Modifications and Variations

As will be recognized by those skilled in the art, the innovative concepts described in the present application can be modified and varied over a tremendous range of applications, and accordingly the scope of patented subject matter is not limited by any of the specific exemplary teachings given. It is intended to embrace all such alternatives, modifications and variations that fall within the spirit and broad scope of the appended claims.

For example, the calibration value loaded into the counter at startup does not have to be purely the stored value (indicating process variation), but can also include a factor for temperature compensation, or even supply voltage compensation.

For another example, in alternative embodiments additional delay calibration values or extrapolation parameters can be stored, to allow for more precise fitting to modeled behavior where this is desired.

For another example, in alternative embodiments a calibrated free-running oscillator as above can be combined with other oscillator types which are activated under different conditions.

Reference is also made to the following commonly owned and copending U.S. patent applications, each and every one of which is hereby incorporated by reference in its entirety: 60/934,936 filed Dec. 31, 2006; 60/921,507 filed Dec. 31, 2006; 60/934,918 filed Dec. 31, 2006; 60/934,917 filed Dec. 31, 2006; 60/999,760 filed Dec. 31, 2006; 60/934,923 filed Dec. 31, 2006; 60/934,937 filed Jan. 1, 2007; 60/921,508 filed Jan. 1, 2007; Ser. No. 11/618,849 filed Dec. 31, 2006; Ser. No. 11/618,852 filed Dec. 31, 2006; Ser. No. 11/618,865 filed Dec. 31, 2006; Ser. No. 11/618,867 filed Dec. 31, 2006; Ser. No. 11/649,325 filed Dec. 31, 2006; Ser. No. 11/649,326 filed Dec. 31, 2006; Ser. No. 11/965,943 filed Dec. 28, 2007; Ser. No. 11/966,012 filed Dec. 28, 2007; and Ser. No. 11/966,147 filed Dec. 28, 2007. None of these applications are necessarily related to the present application, but many of these help to show features which were designed into the same system as the ideas described above, and/or which combine synergistically with those ideas. Some ones of these copending applications may have overlapping inventorship with the present application, and hence be eligible for a domestic priority claim under U.S. law, but priority is not necessarily claimed nor disclaimed at this time.

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle.

The claims as filed are intended to be as comprehensive as possible, and NO subject matter is intentionally relinquished, dedicated, or abandoned.

What is claimed is:

1. A method for time measurement within an integrated circuit, comprising the actions of:
    (a) after fabrication of the integrated circuit is complete, measuring the speed of a free-running oscillator;
    (b) based on said action (a), storing a calibration value in nonvolatile NAND flash memory; and thereafter
    (c) when said oscillator is powered up, retrieving said calibration value and accordingly changing the number of cycles of said oscillator per interval measured.

2. The method of claim 1, wherein said free-running oscillator is a purely digital oscillator.

3. The method of claim 1, wherein said free-running oscillator comprises a ring oscillator.

4. The method of claim 1, wherein said free-running oscillator comprises an odd number of inverter stages in series, which are not loaded by any off-chip discrete reactance.

5. The method of claim 1, wherein said step (a) is performed at the time of wafer testing.

6. The method of claim 1, wherein said step (a) is performed after packaging.

7. The method of claim 1, wherein said calibration value includes at least four bits of data.

8. The method of claim 1, wherein said changing action is performed using a counter to divide down the output of said oscillator.

9. The method of claim 1, wherein said changing action is performed using a counter which is integrated with said oscillator.

10. A method for providing a time measurement within an integrated circuit, comprising the actions of:
    powering up a free-running oscillator for at least some measurements;
    retrieving a calibration value from nonvolatile NAND flash memory, and accordingly switching gates to change a timing output which is based on said oscillator.

11. The method of claim 10, wherein said free-running oscillator is a purely digital oscillator.

12. The method of claim 10, wherein said free-running oscillator comprises an odd number of inverter stages in series, which are not loaded by any off-chip discrete reactance.

13. The method of claim 10, wherein said calibration value includes at least four bits of data.

14. The method of claim 10, wherein said switching action is performed using a counter which divides down the output of said oscillator by a programmable value.

15. The method of claim 10, wherein said changing action is performed using a counter which is integrated with said oscillator.

16. A method for operating a portable memory module, comprising the actions of:
    when interface timing measurement is required, powering up a free-running digital oscillator;

retrieving a calibration value from nonvolatile memory which is integrated with said oscillator, and accordingly switching gates to change the output timing of said oscillator; and then measuring an interface timing relationship using the output timing of said oscillator.

17. The method of claim 16, wherein said free-running oscillator is a purely digital oscillator.

18. The method of claim 16, wherein said free-running oscillator comprises a ring oscillator.

19. The method of claim 16, wherein said free-running oscillator comprises an odd number of inverter stages in series, which are not loaded by any off-chip discrete reactance.

20. The method of claim 16, wherein said nonvolatile memory is NAND flash.

21. The method of claim 16, wherein said calibration value includes at least four bits of data.

22. The method of claim 16, wherein said switching action is performed using a counter which divides down the output of said oscillator by a programmable value.

23. The method of claim 16, wherein said changing action is performed using a counter which is integrated with said oscillator.

24. An integrated circuit, comprising:
a digital oscillator;
a nonvolatile NAND flash memory which holds a calibration value indicative of the process variation component of the speed of said oscillator; and
selection logic which selects the number of cycles of said oscillator per interval measured, in dependence on said stored calibration value.

25. The integrated circuit of claim 24, wherein said free-running oscillator comprises a ring oscillator.

26. The integrated circuit of claim 24, wherein said free-running oscillator comprises an odd number of inverter stages in series, which are not loaded by any off-chip discrete reactance.

27. The integrated circuit of claim 24, wherein said calibration value includes at least four bits of data.

28. The integrated circuit of claim 24, wherein a counter is connected to divide down the output of said oscillator.

29. The integrated circuit of claim 24, wherein a counter which is integrated with said oscillator divides down the output of said oscillator.

30. An integrated circuit, comprising:
a free-running digital oscillator;
a nonvolatile memory which holds a calibration value indicative of the process variation component of the speed of said oscillator; and
selection logic which selects the number of cycles of said oscillator per interval measured, in dependence on said stored calibration value; and
a timing measurement stage, which outputs indications of interface timing windows in accordance with an output of said oscillator as modified by said selection logic.

31. The integrated circuit of claim 30, wherein said free-running oscillator is a purely digital oscillator.

32. The integrated circuit of claim 30, wherein said free-running oscillator comprises a ring oscillator.

33. The integrated circuit of claim 30, wherein said free-running oscillator comprises an odd number of inverter stages in series, which are not loaded by any off-chip discrete reactance.

34. The integrated circuit of claim 30, wherein said nonvolatile memory is NAND flash.

35. The integrated circuit of claim 30, wherein said calibration value includes at least four bits of data.

36. The integrated circuit of claim 30, wherein a counter divides down the output of said oscillator.

37. An integrated circuit, comprising:
a free-running digital oscillator;
a nonvolatile memory which holds a calibration value indicative of the process variation component of the speed of said oscillator; and
selection logic, integrated with said oscillator, which selects the number of cycles of said oscillator per interval measured, in dependence on said stored calibration value as loaded at power-up; and
a timing measurement stage, which outputs indications of interface timing windows in accordance with an output of said oscillator as modified by said selection logic.

38. The integrated circuit of claim 37, wherein said free-running oscillator is a purely digital oscillator.

39. The integrated circuit of claim 37, wherein said free-running oscillator comprises a ring oscillator.

40. The integrated circuit of claim 37, wherein said free-running oscillator comprises an odd number of inverter stages in series, which are not loaded by any off-chip discrete reactance.

41. The integrated circuit of claim 37, wherein said nonvolatile memory is NAND flash.

42. The integrated circuit of claim 37, wherein said calibration value includes at least four bits of data.

43. The integrated circuit of claim 37, wherein a counter is connected to divide down the output of said oscillator.

44. A circuit comprising:
means for, at startup, loading a calibration value, obtained at least partly from nonvolatile NAND flash memory, into a divider circuit; and
means for dividing down the output of a digital oscillator by said calibration value, to thereby produce a partially calibrated resultant timing signal.

45. The circuit of claim 44, wherein said oscillator comprises a ring oscillator.

46. The circuit of claim 44, wherein said oscillator comprises an odd number of inverter stages in series, which are not loaded by any off-chip discrete reactance.

47. The circuit of claim 44, wherein said calibration value includes at least four bits of data.

48. The circuit of claim 44, wherein a counter is connected to divide down the output of said oscillator.

* * * * *